US009286424B1

(12) United States Patent
Larzul et al.

(10) Patent No.: US 9,286,424 B1
(45) Date of Patent: Mar. 15, 2016

(54) EFFICIENT WAVEFORM GENERATION FOR EMULATION

(71) Applicant: Synopsys, Inc., Mountain View, CA (US)

(72) Inventors: Ludovic Marc Larzul, Folsom, CA (US); Alexander Rabinovitch, Shrewsbury, MA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/703,718

(22) Filed: May 4, 2015

(51) Int. Cl.
*G06F 17/50* (2006.01)
*G06F 11/36* (2006.01)

(52) U.S. Cl.
CPC ........ *G06F 17/5027* (2013.01); *G06F 17/5068* (2013.01); *G06F 11/3636* (2013.01); *G06F 11/3652* (2013.01); *G06F 17/5022* (2013.01); *G06F 17/5054* (2013.01)

(58) Field of Classification Search
CPC ............ G06F 17/5027; G06F 17/5054; G06F 17/5022; G06F 11/3652; G06F 11/3636
USPC ............................ 703/13–14, 23, 28; 716/136
See application file for complete search history.

(56) References Cited

U.S. PATENT DOCUMENTS

| 5,790,832 | A | | 8/1998 | Barbier et al. |
| 5,884,066 | A | * | 3/1999 | Kuijsten ......................... 703/28 |
| 6,009,256 | A | | 12/1999 | Tseng et al. |
| 6,134,516 | A | * | 10/2000 | Wang et al. .................... 703/27 |
| 7,379,860 | B1 | * | 5/2008 | Bartz et al. ..................... 703/28 |
| 7,379,861 | B2 | * | 5/2008 | Kfir et al. ....................... 703/28 |
| 7,571,086 | B2 | | 8/2009 | Chang et al. |
| 7,979,745 | B2 | * | 7/2011 | Moroda .......................... 714/28 |
| 8,706,467 | B2 | * | 4/2014 | Rabinovitch ........ G06F 17/5009 703/13 |
| 8,898,051 | B2 | * | 11/2014 | Sarkisian et al. ............... 703/23 |
| 2004/0148153 | A1 | * | 7/2004 | Beletsky et al. ................ 703/27 |
| 2008/0222453 | A1 | * | 9/2008 | Bartz et al. ..................... 714/28 |
| 2009/0259457 | A1 | * | 10/2009 | Quennesson et al. ............ 703/23 |
| 2010/0280814 | A1 | * | 11/2010 | Rabinovitch ........ G06F 17/5022 703/16 |
| 2014/0143745 | A1 | * | 5/2014 | Marcus et al. ................ 716/107 |

* cited by examiner

*Primary Examiner* — Stacy Whitmore
(74) *Attorney, Agent, or Firm* — Fenwick & West LLP

(57) ABSTRACT

An emulation environment includes a host system and an emulator. The host system configures the emulator to emulate a design under test (DUT) and the emulator emulates the DUT accordingly. During emulation, the emulator traces limited signals of the DUT and stores values of the traced signals. When values of certain signals of the DUT are needed for analysis or verification of the DUT but the signals were not traced by the emulator, the host system simulates one or more sections of the DUT to obtain values of the signals. Signals traced by the emulator are used as inputs to simulate the one or more sections.

19 Claims, 6 Drawing Sheets

EFFICIENT WAVEFORM GENERATION FOR EMULATION

BACKGROUND

1. Field of Art

The disclosure generally relates to the emulation of circuits, and more specifically to obtaining emulation results.

2. Description of the Related Art

Emulators have been developed to assist circuit designers in designing and debugging highly complex integrated circuits. An emulator includes multiple reconfigurable components, such as field programmable gate arrays (FPGAs) that together can imitate the operations of a design under test (DUT). By using an emulator to imitate the operations of a DUT, designers can verify that a DUT complies with various design requirements prior to fabrication.

One aspect of emulation includes emulating a DUT and retrieving emulation results from the emulator. Emulation results can be analyzed to verify, for example, timing relationships and digital logic operations of the DUT. In one approach, emulation results are transferred to another system for performing analysis. For example, waveforms of the emulation results are generated at another system to graphically represent timing relationships and digital logic operations of the DUT. In advanced processes (e.g., 22 nm and below), a DUT may include billions of logic circuits and signals. Emulating such a complex DUT involves transferring an extremely large amount of data including states or values of billions of signals for a large number of cycles from the emulator to another system. Therefore, conventional emulation environment is inefficient in terms of hardware and communication resources employed for transferring data without slowing down the emulator system.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
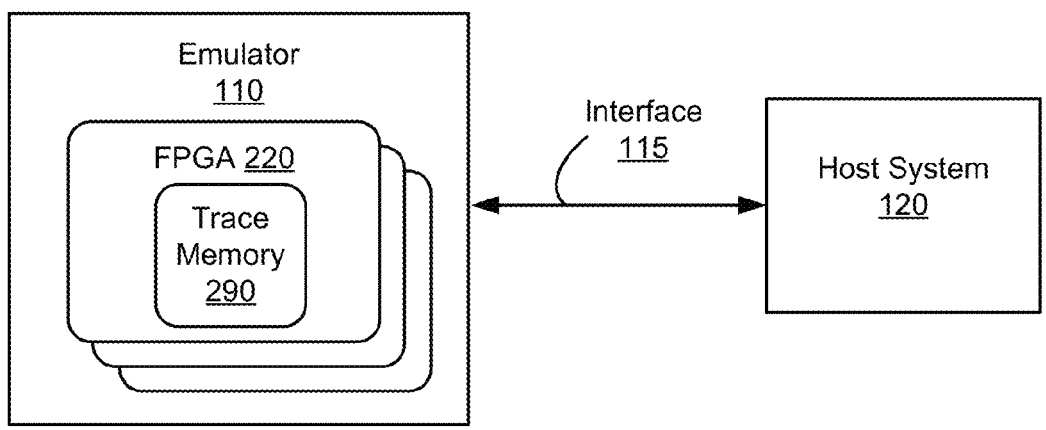
FIG. 1 is a block diagram of an emulation environment, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "230A," indicates that the text refers specifically to the element having that particular reference numeral. A reference numeral in the text without a following letter, such as "230," refers to any or all of the elements in the figures bearing that reference numeral.

Overview

A disclosed emulation environment performs bandwidth and resource efficient analysis of a design under test (DUT). One embodiment of the emulation environment includes a host system and an emulator. The host system configures the emulator to emulate the DUT and the emulator emulates the DUT accordingly. During emulation, the emulator traces limited signals of the DUT and stores values (e.g., state) of the traced signals. In one embodiment, the traced signals comprise multiple cycles of the DUT. When values of certain signals of the DUT are needed for analysis or verification of the DUT but the signals were not traced by the emulator, the host system determines one or more sections of the DUT that allow the signals to be traced and simulates those sections to produce the untraced signals (e.g., that comprise one or more cycles). Signals traced (i.e., emulated) by the emulator are used to simulate the one or more sections. Hence, by the host system being able to simulate sections of the DUT, the host system is able to obtain values of additional DUT signals and the emulator can trace fewer signals. Further, since fewer signals are traced by the emulator, values of fewer signals are exchanged between the emulator and the host system, thereby achieving a savings in communication bandwidth. Additionally, the solution is very scalable. Since the required signals can be balanced with simulation computation, the solution is not affected by DUTs getting bigger and more complex. For example, fewer signals can be traced and more signals can be computed by simulation.

Emulation herein refers to imitating the behavior of an electronic design with configurable hardware components.

Simulation herein refers to imitating the behavior of an electronic design with software models.

A signal herein refers to, but is not limited to, a net, a wire, a variable, a port, or an element of a design having a value carried, monitored or traced.

Tracing/producing a signal herein refers to obtaining values of the signal based on emulation or simulation of an electronic design. Further, when referring to a signal herein, it refers to the signal in an electronic design or a value of the signal.

Emulation Environment

FIG. 1 is a block diagram illustrating an emulation environment 100, according to one embodiment. The emulation environment 100 includes an emulator 110 and a host system 120. The emulator 110 and the host system 120 communicate through an interface 115.

The interface 115 is a communication medium that allows communication between the host system 120 and the emulator 110. In one embodiment, the interface 115 is one or more cables with electrical connections. For example, the interface 115 may be one or more RS232, USB, LAN, optical, IEEE 1394 (FireWire), or custom built cables. In other embodiment, the interface 115 is a wireless communication medium or a network with one or more points of access. For another example, the interface 115 may be a wireless communication medium employing a Bluetooth® or IEEE 802.11 protocol. In one embodiment, the interface 115 is enabled during the operation of the host system 120 and the emulator 110. In one embodiment, the interface 115 is only enabled when the host system 120 and the emulator 110 need to exchange information with each other.

The emulator 110 is a hardware system that emulates designs under test (DUTs). A DUT includes one or more circuit designs. The DUT emulated can be either combinatorial, sequential, or a combination of both. The emulator 110 includes multiple field-programmable gate arrays (FPGAs) 220 that can be configured to emulate a DUT. Each FPGA 220 includes a trace memory 290 (e.g., trace buffer) that stores values of signals traced by the FPGA 220 during emulation (e.g., the states of DUT signals during emulation). In other embodiments, the emulator 110 includes other types of configurable logic circuits instead of FPGAs 220. In other embodiments, the emulator 110 includes one or more trace memories 290 separate from the FPGAs 220, where the one or more trace memories 290 can be used by multiple FPGAs 220 for storing data. In other embodiments, the emulator 110 includes a mix of FPGA 220 or other configurable circuits and a mix of memories located in the components or separated from them, in order to achieve an optimal trace system. In another embodiment, the emulator 110 does not contain memories dedicated to trace, and uses memories that could be used to model the design, or stream the traced data directly over the interface 115. The emulator 110 may transmit values of traced signals stored in one or more trace memories 290 to the host system 120, after the emulation is finished or during the emulation. The emulator 110 may also transmit values of traced signals stored in one or more trace memories responsive to receiving a request from the host system 120 or prior to receiving a request from the host system 120. The values of the traced signals transmitted to the host system 120 by the emulator 110 can span multiple DUT cycles.

For a DUT that is to be emulated, the emulator 110 receives from the host system 120 through the interface 115 one or more binary files including a description of the DUT (e.g., a mapping of a gate level or a hardware description language (HDL) level description of the DUT). The binary files describe partitions of the DUT created by the host system 120 and a mapping of each partition to an FPGA 220. Based on the binary files, the emulator 110 configures each FPGA 220 to emulate the partition of the DUT mapped (assigned) to it and to trace certain signals in its respective partition. The FPGAs 220 collectively emulate the DUT. The values of signals traced by an FPGA 220 during emulation are temporarily stored by the FPGA 220 in its trace memory 290 before being transferred to the host system 120 through the interface 115. These signals as described below are used for generating additional information and/or processing the results of the emulation of the DUT.

The host system 120 configures the emulator 110 to emulate a design under test (DUT). The host system 120 may be a single computer or a collection of multiple computers. In the embodiment where the host system 120 is comprised of multiple computers, the functions described herein as being performed by the host system 120 may be distributed among the multiple computers. The host system 120 may be indirectly connected to the emulator 110 through another device, computer or network.

The host system 120 receives from a user a description of a DUT to be emulated by the emulator 110. In one embodiment, the description of the DUT is in a type of HDL, such as register transfer language (RTL). The host system 120 creates a gate level netlist based on the HDL description of the DUT. The host system 120 uses the HDL or the gate level netlist to partition the DUT into multiple partitions. The host system 120 maps (assigns) each partition to one or more FPGAs 220 included in the emulator 110. Together the FPGAs 220 will emulate the DUT and trace certain signals of the DUT.

The host system 120 creates binary files, which include information to configure the FPGAs 220 based on the DUT and the mappings. A binary file may include, for example, a design description of one or more partitions (e.g., gate level or HDL description), mapping information (e.g., mappings of partitions), connection information (e.g., connections between components of the DUT and/or connections between FPGAs) and design constraints for the DUT.

In addition, the host system 120 identifies sections of the DUT that are to be available for simulation by the host system 120. A section of the DUT may be a part of a partition or encompass an entire partition. In one embodiment, the aggregate of the sections encompass the entire DUT. Alternatively, the aggregate of the sections may encompass a portion of the DUT. In another embodiment, a section of the DUT may be a part of multiple partitions available for simulation. In one embodiment, at least one edge (e.g., circuits or signals) of a section corresponds to an edge (e.g., circuits or signals) of a partition. In another embodiment, any edge (e.g., circuits or signals) of a section may not correspond to edges (e.g., circuits or signals) of a partition.

The sections of the DUT are identified so that when necessary the host system 120 can simulate a section to obtain values of certain signals of the DUT section that are not traced by the emulator 110 during emulation of the DUT. Hence, although a section of the DUT is emulated by the emulator 110 when emulating the DUT, the host system 120 may also simulate the section to produce additional signals that were not traced by the emulator 110. As an example, assume that for performing analysis of the DUT values of a certain signal are desired, but that signal is not traced by the emulator 110 during emulation of the DUT. The host system 120 can simulate a section of the DUT that includes the signal to obtain values of the desired signal (i.e., produce the signal). In one embodiment, the host system 120 identifies and simulates sections for each additional signal that needs to be produced (i.e., simulated). In another embodiment, the host system 120 identifies and simulates sections for a subset of the DUT signals or entire DUT signals that were not traced by the emulator 110.

The host system 120 creates one or more section files that describe the circuitry of each identified section. In one embodiment, a section file is created for each identified section. For example, the section file can be original HDL, modified HDL obtained from the original HDL, HDL deduced from the gate level netlist, a gate-level netlist, a system C model, C/C++ model, a binary representation, or any representation of the design that allows simulation of a partial behavior of the design from a subset of the signals. The host system 120 also generates signal information describing signals produced for each identified section of the DUT when simulated by the host system 120 and signals traced for each partition when emulated by the emulator 110. For a section, the signal information also describes which signals (or values of signals) are needed to simulate a section. The signals needed may be signals traced by the emulator 110 during emulation. In one embodiment, the signals traced by the emulator 110 during emulation are inputs of identified sections. The signals needed may also be signals obtained from simulating one or more other sections. The host system 120 stores the generated signal information, along with the section and binary files.

The host system 120 transmits the binary files to the emulator 110 so that the emulator 110 can configure the FPGAs 220 to emulate their respective mapped partition. The host system 120 instructs the emulator 110 to emulate the DUT. Each FPGA 220 emulates its respective partition and stores values of signals traced during the emulation in its trace memory 290. In one embodiment, contents in the trace memory 290 are transmitted to the host system 120 by the emulator 110 through the interface 115, when the FPGAs 220 are not emulating the DUT. In another embodiment, the emulator 110 transmits to the host system 120 through the interface 115 the contents in the trace memory 290 while the FPGAs 220 are emulating the DUT, thereby generating and transmitting a stream of traced information over the interface 115 in parallel with the emulation of the DUT.

Further, the host system 120 receives verification settings indicating values of signals of the DUT that are needed for performing analysis or verification of the DUT. The verification settings may be, for example, a request from a user to trace certain signals of the DUT for debugging or testing the DUT. The verification settings may also include a state machine used for analyzing the performance of the DUT. The verification settings may include a system C model, C/C++ model, program or scripts analyzing design emulation results.

Based on the received verification settings, the host system 120 identifies values of signals of the DUT that need to be obtained for performing analysis of the DUT. Based on the stored signal information, the host system 120 identifies sections of the DUT that when simulated provide values of one or more of the identified signals. Additionally, the host system 120 determines which of the signals traced by the emulator's FPGAs 220 are needed to simulate the identified sections.

The host system 120 retrieves one or more stored section files that describe the design of identified sections and simulates the identified sections using values of the traced signal received from the emulator 110. The simulation of the identified sections results in the host system 120 producing the identified signals (e.g., comprising multiple cycles) needed for performing analysis of the DUT. In one embodiment, the host system 120 generates a user interface that includes one or more of the identified signals displayed as waveforms. In one embodiment, if certain signals needed for simulating the identified sections were not traced by the emulator 110, the host system 120 simulates one or more other sections to produce those signals.

By simulating sections of the DUT in the host system 120, the host system 120 is able to generate certain signals of the DUT instead of the emulator 110 having to trace those signals thereby limiting the amount of signals traced by the emulator 110. Further, since fewer signals are being traced by the emulator 110, the amount of signal values exchanged between the host system 120 and the emulator 110 also decreases, thereby reducing the bandwidth used between the emulator 110 and the host system 120 to transport the same amount of global information. Furthermore, the amount of logic potentially added in the design or during the design process, to trace and transmit to the host system 120 is reduced.

Figure 2:
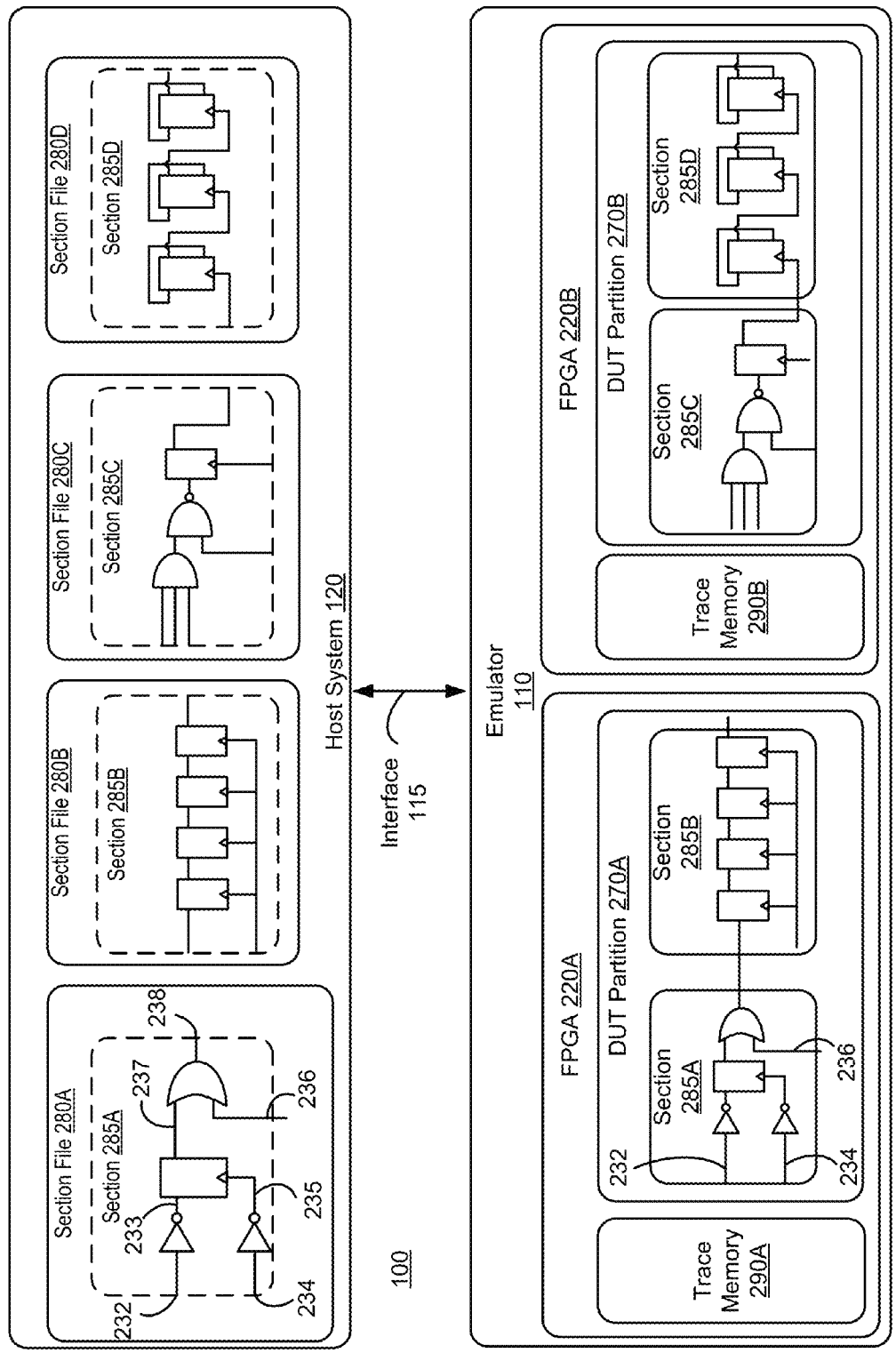
FIG. 2 illustrates an example of an emulation environment with example circuits of a DUT, according to one embodiment.

FIG. 2 illustrates an example of the emulation environment 100 with example circuits of a DUT, according to one embodiment. In the example, the emulator 110 includes two FPGAs 220A and 220B. FPGA 220A includes trace memory 290A and FPGAs 220B includes trace memory 290B. Based on binary files received from the host system 120, FPGA 220A is configured to emulate DUT partition 270A which is comprised of sections 285A and 285B. Additionally, FPGA 220B is configured to emulate DUT partition 270B which is comprised of sections 285C and 285D. Each FPGA 220 emulates its respective partition 270 and values of signals traced during the emulation are stored by the FPGA 220 in its trace memory 290. In this example, when FPGA 220A emulates partition 270A, signals 232, 234, and 236 of section 285A are traced and stored in trace memory 290A (additional signals may be traced for section 285B). In this example, each section 285 is implemented in its corresponding partition 270. Alternatively, a section 285 may be implemented across multiple FPGAs 220 such that a portion of the section 285 is implemented in one FPGA 220 and portions of the same section 285 are implemented in one or multiple other FPGAs 220.

The host system 120 includes a section file 280A describing section 285A, a section file 280B describing section 285B, section file 280C describing section 285C, and section file 280D describing section 285D. Assume that in this example, values of signals 233, 235, 237, and/or 238 of section 285A are needed for analysis of the DUT (e.g., requested to be traced by a user of the host system 120). The host system 120 can retrieve values of traced signals 232, 234, and 236 from the trace memory 290A, and simulate section 285A using section file 280A and the retrieved values of signals 232, 234, and 236 as inputs. By simulating section 285A, the host system 120 can produce signals 233, 235, 237, and 238. Hence, even though section 285A has already been emulated by FPGA 220A, the host system 120 will simulate the section 285A to obtain values of signals 233, 235, 237, and 238.

In another example, only values of signal 237 is needed for analysis of the DUT, but the host system 120 still retrieves values of traced signals 232, 234, and 236 from the trace memory 290A to simulate section 285A. By simulating section 285A, the host system 120 produces signal 237. Additionally, the host system 120 can produce signals 233 and 235, even though these signals 233 and 235 are not requested.

Since the host system 120 can obtain values of these signals 233, 235, 237, and 238 by simulating the section 285A, the emulator 110 does not have to be configured to trace those signals 233, 235, 237, and 238. In an environment where millions of signals are traced, having the host system 120 capable of simulating sections of a DUT will dramatically reduce the amount of signals that have to be traced by the FPGAs 220 and the amount of values of signals exchanged between the emulator 110 and the host system 120, thereby conserving emulation resources, communication bandwidth and improving the speed of emulation.

Further, the host system 120 only simulates those sections 285 that are necessary for obtaining needed signals. In this example, since only values of signals from section 285A are needed, the host system 120 only simulates section 285A and does not simulate sections 285B, 285C, and 285D, thereby conserving host system 120 resources. However, if values of signals from section 285B, 285C, and/or 285D were needed, those sections could be simulated by the host system 120, at the same time as section 285A or sequentially.

In one embodiment, the host system 120 simulates only a portion or a sub-section of a section 285 to obtain necessary signals for performing analysis. For example, a signal 233 of the section 285A may be needed to perform analysis or simulate another section 285 without other signals 234, 235, 236, 237, and 238. In this case, only a sub-section of the section 285A may be simulated with a signal 232 as an input to generate the signal 233 without simulating the entire section 285A. As a result, hardware resources to perform simulation can be reduced and results can be achieved faster.

Figure 3:
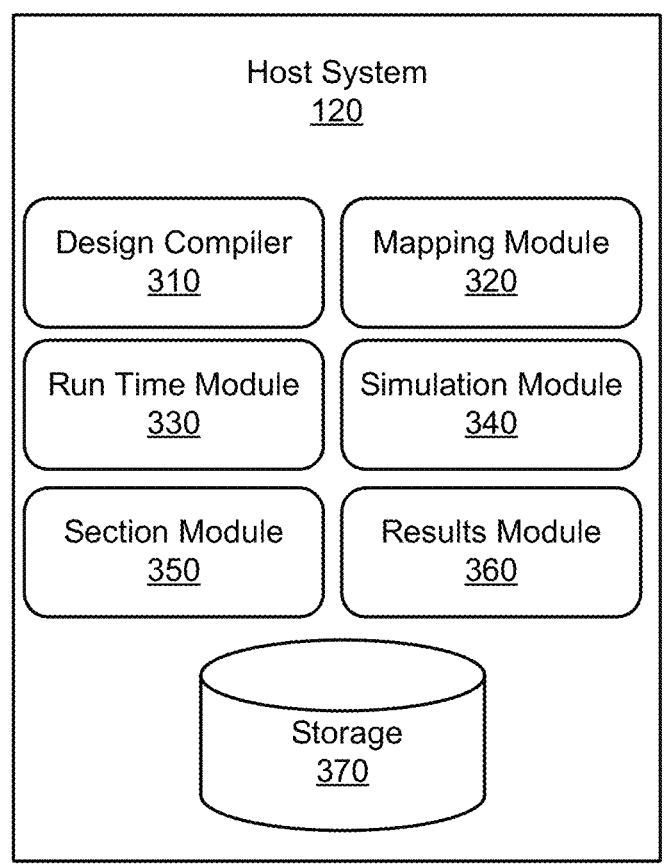
FIG. 3 is a block diagram of the host system, according to one embodiment.

FIG. 3 is a block diagram illustrating the host system 120 in more detail, according to one embodiment. The host system 120 includes a design compiler 310, mapping module 320, run time module 330, simulation module 340, section module 350, results module 360 and storage 370. Each of these components may be embodied as hardware, software, firmware, or a combination thereof.

The design compiler 310 converts HDL of DUTs into gate level logic. For a DUT that is to be emulated, the design compiler 310 receives a description of the DUT in HDL (e.g., RTL or other level of abstraction). The design compiler 310 synthesizes the HDL of the DUT to create a gate level netlist with a description of the DUT in terms of gate level logic.

In one embodiment, the design compiler 310 identifies signals of the DUT to be traced by the emulator 110 during emulation of the DUT. In one embodiment, the identified signals do not include all signals in the DUT or all states of the DUT. In one embodiment, information is received from a user or from another system indicating the signals of the DUT that should be traced. The design compiler 310 incorporates signal tracing logic into the DUT to enable tracing of each identified signal. In one embodiment, the design compiler 310 incorporates the signal tracing logic prior to synthesizing the HDL to create the netlist. In this embodiment, prior to synthesizing, the design compiler 310 retrieves HDL of the signal tracing logic from the storage 370 and edits the HDL of the DUT to include the retrieved HDL of the signal tracing logic.

In another embodiment, the design compiler 310 incorporates the signal tracing logic after creating the netlist for the DUT. In this embodiment, the design compiler 310 retrieves a gate level description of the signal tracing logic from the storage 370 and edits the gate level netlist to include the gate level description of the signal tracing logic.

In another embodiment, the description of the DUT received by the design compiler 310 already includes the signal tracing logic. Hence, in this embodiment, the design compiler 310 does not need to add signal tracing logic to trace the identified signals.

The mapping module 320 maps DUTs to FPGAs 220 of the emulator 110. After the design compiler 310 incorporates the signal tracing logic into a DUT and creates a gate level netlist, the mapping module 320 partitions the DUT at the gate level into a number of partitions using the netlist. In one embodiment, the mapping module 320 partitions the DUT by identifying one or more partitions of the DUT to be emulated based on available sections and/or signals needed to perform analysis of the DUT. The mapping module 320 may identify the one or more partitions in a manner that only a minimum number of signals may be traced by the emulator 110. In one embodiment, the mapping module 320 identifies the one or more partitions based on the available bandwidth of the interface. Alternatively, the mapping module 320 may identify the one or more partitions in a manner that only a minimum number of sections may be simulated by the host system 120. The mapping module 320 maps each partition to a corresponding FPGA 220 of the emulator 110. In one approach, the mapping module 320 performs the partitioning and mapping using one or more of the following: design rules, design constraints (e.g., timing or logic constraints), available resources in FPGA 220, limitations on trace memories 290, gates resulting from the HDL, HDL source code, user inputs, and information about the emulator 110.

The mapping module 320 generates one or more binary files to configure the FPGAs 220 to emulate their respective partition. In one embodiment, the mapping module 320 generates a binary file for each FPGA 220. The mapping module 320 stores the binary files in the storage 370. The mapping module 320 also stores signal information in the storage 370 indicating which signals are traced by each FPGA 220 based on the mappings.

The section module 350 identifies sections of the DUT that are to be available for simulation by the simulation module 340 of the host system 120. For example, the section module 350 partitions the DUT into a number of sections. Similar to the mapping module 320, the section module 350 may identify the sections of the DUT that are to be simulated by the simulation module 340 using one or more of the following: speed of simulation, number of HDL lines, number of gates resulting from the HDL, number of input signals required, simulation constraints, design rules, design constraints, user inputs, and emulator information. The section module 350 may create sections to accelerate performing simulation or performing analysis of a DUT considering the design itself without considering hardware capacity. For example, the section module 350 may consider a size of the interface, a number of signals and/or clock frequency of signals of the sections, when creating sections. In addition, the section module 350 may consider time or a number of processes executed by one or more processors to simulate a section, when creating sections. After identifying sections of the DUT, the section module 350 generates section files that describe the design (e.g., circuitry) of each identified section of the DUT. In one embodiment, the section module 350 creates a section file for each identified section. The section module 350 stores the section files in the storage 370. The section module 350 also stores in the storage 370 signal information describing for each identified section the DUT signals traced when the section is simulated and signals (e.g., input signals) of the DUT needed to simulate the section.

An identified section may include a part of a partition or an entire partition. In one embodiment, the aggregate of the identified sections models the entire DUT. However, all of the sections may not be simultaneously simulated by the simulation module 340 as described below. In another embodiment, the aggregate of the identified sections models only a portion of the DUT. Yet in another embodiment, a part of the DUT can be included in multiple sections.

The run time module 330 configures the emulator 110 for performing the emulation of a DUT. The run time module 330 transmits to the emulator 110 via interface 115 binary files stored in the storage 370 for the DUT to configure the FPGAs 220 of the emulator 110 to emulate the DUT. The run time module 330 instructs the emulator 110 to emulate the DUT. In one embodiment, prior to the start of the emulation or during the emulation of the DUT, the run time module 330 transmits to the emulator 110 input parameters and/or state machines to configure and control the emulation of the DUT.

The simulation module 340 simulates section of DUTs. The simulation module 340 can simulate any type of section. The section simulated by the simulation module 340 includes combinatorial, sequential, or a combination of both types of circuits. In one embodiment, the simulation module 340 can simulate a non-synthesizable portion of a circuit. In another embodiment, the simulation module 340 is a software that cannot compute anything else than the signals, while in another embodiment, the simulation module 340 could be used to compute any kind of circuit, not limited to a circuit compiled to an emulator.

The simulation module 340 receives verification settings indicating signals of a DUT that are needed for performing analysis or verification of the DUT. The verification settings may include a request to trace certain signals or a state machine used for analyzing the DUT. The verification settings may be received from a user, from another system or be part of the emulator 110 or the DUT.

The simulation module 340 identifies the values of signals of the DUT that need to be obtained based on the verification settings. From the signal information stored in the storage 370, the simulation module 340 identifies which sections of the DUT when be simulated produce one or more of the identified signals. The simulation module 340 further determines which signals are needed to simulate the identified sections. The simulation module 340 identifies the needed signals that have been traced by the emulator 110. If the needed signals have not yet been obtained from the emulator 110, the simulation module 340 requests and receives the signals from the emulator 110. In one embodiment, if a signal needed to simulate an identified section is not traced by the emulator 110, the simulation module 340 simulates one or more sections to obtain the needed signal.

Based on the correspondence between values of signals obtainable and inputs needed for each section, the simulation module 340 determines sections to be simulated. In one embodiment, the simulation module 340 identifies sections to be simulated in a manner that a minimum number of sections or a minimum number of input signals are needed to produce a desired signal. Alternatively, the simulation module 340 identifies sections to be simulated based on the available bandwidth of the interface 115.

In one embodiment, for one or more sections, instead of determining to simulate the entire section, the simulation module 340 may determine to only simulate a portion or a sub-section of the section of the DUT to produce one or more of the identified signals. The sections or sub-sections of the section may be identified such that a minimum number of signals are traced or a minimum number of sections are simulated.

The simulation module 340 simulates each of the identified sections using values of the signals obtained (e.g., from the emulator 110 or by simulating other sections). The simulation module 340 may also simulate sections using provided input parameters (e.g., from a user). The simulation module 340 stores values of the signals traced during the simulations of the sections in the storage 370. In one embodiment, the simulation module 340 also retrieves from the emulator 110 values of signals identified in the verification settings that have already been traced by the emulator 110 when emulating the DUT. The simulation module 340 stores values of the traced signals retrieved from emulator 110 in the storage 370.

As an example, returning to FIG. 2, assume that based on the verification settings it is determined that signal 237 in section 285A needs to be traced but the signal 237 is not traced by the emulator 110. In this case, the simulation module 340 will simulate section 285A to obtain signal 237.

As described above, additional sections may be simulated to produce an input signal needed for simulating a section. For example, assume that a determination is made to simulate section 285D to obtain a certain signal value from section 285D. Further assume that signal 233 from section 285A is an input of section 285D. To be able to simulate section 285D, section 285A is first simulated to produce signal 233. Once signal 233 is obtained, section 285D can be simulated.

The simulation module 340 is invoked and retrieves the traced signals according to the status of the interface 115. In one embodiment, the interface 115 between the emulator 110 and the host system 120 is enabled during the emulation of the DUT. The simulation module 340 retrieves values of the signals traced by the emulator 110 during the emulation of the DUT performed by the emulator 110. The simulation module 340 also simulates the identified section during the emulation of the DUT.

In one embodiment, the emulator 110 stores all or some of the traced values in the storage 370 while the interface 115 is enabled. Regardless of the DUT being emulated or not, the simulation module 340 can retrieve the values of the signals stored by the emulator 110 in the storage 370 and simulate some sections of the DUT in order to provide signal values that were not stored already. The simulation module 340 can then store the simulated signal values into the storage 370, or provide those values on a GUI interface, or to a script or software program running on the host system 120, which may have requested some of those values.

In one embodiment, the interface 115 between the host system 120 and the emulator 110 is disabled during emulation and enabled after the emulation is complete. The simulation is performed after the host system 120 completes emulation of the DUT or a portion of the DUT. When the emulation is complete, the simulation module 340 retrieves signals traced during the emulation via the interface 115, and simulates the identified sections.

In one embodiment, the simulation module 340 is invoked and retrieves the traced signals in an interactive mode. In the interactive mode, the simulation module 340 is invoked by a user monitoring a signal or a small set of signals at a time. The user requests or selects a desired signal, typically in a GUI interface like Verdi waveform viewer from Synopsys, Inc. The simulation module 340 obtains additional signal values through simulation based on the monitored signals. The simulation may be performed locally on a system (e.g., host system) used to run Verdi.

In one embodiment, the simulation module 340 is invoked and retrieves the tracked signals in a non-interactive mode. The simulation module 340 may operate without a user request, but instead may operate based on scripts provided prior to the emulation. The non-interactive mode may be employed when the set of signals is large, up to the full design.

The results module 360 provides results from emulating a DUT and simulating sections of the DUT. The results module 360 processes values of the traced signals produced by the simulations of DUT sections and values of the traced signals retrieved from the emulator 110. In one embodiment, the results module 360 retrieves values of the traced signals from the storage 370 and generates a user interface for display to a user that includes representations of values of the traced signals. In one embodiment, the results module 360 is a waveform viewer that generates waveforms of traced signals for display. In one embodiment, the results module 360 includes an API to create a visual waveform of traced signals for display to a user. Processing the traced signals may also include the results module 360 counting events based on the traced signals. In another embodiment, the results module 360 includes a binary program (obtained from a system C model, C/C++ model or any other software language) or a script processing the signal values to produce information based on the signal values or a display of that information.

In one embodiment, one or more functions of the host system 120 may be performed at another computer (e.g., a collection of dedicated computers or machines). For example, the design compiler 310 and the mapping module 320 may be included in another computer for compiling and partitioning a DUT.

Figure 4:
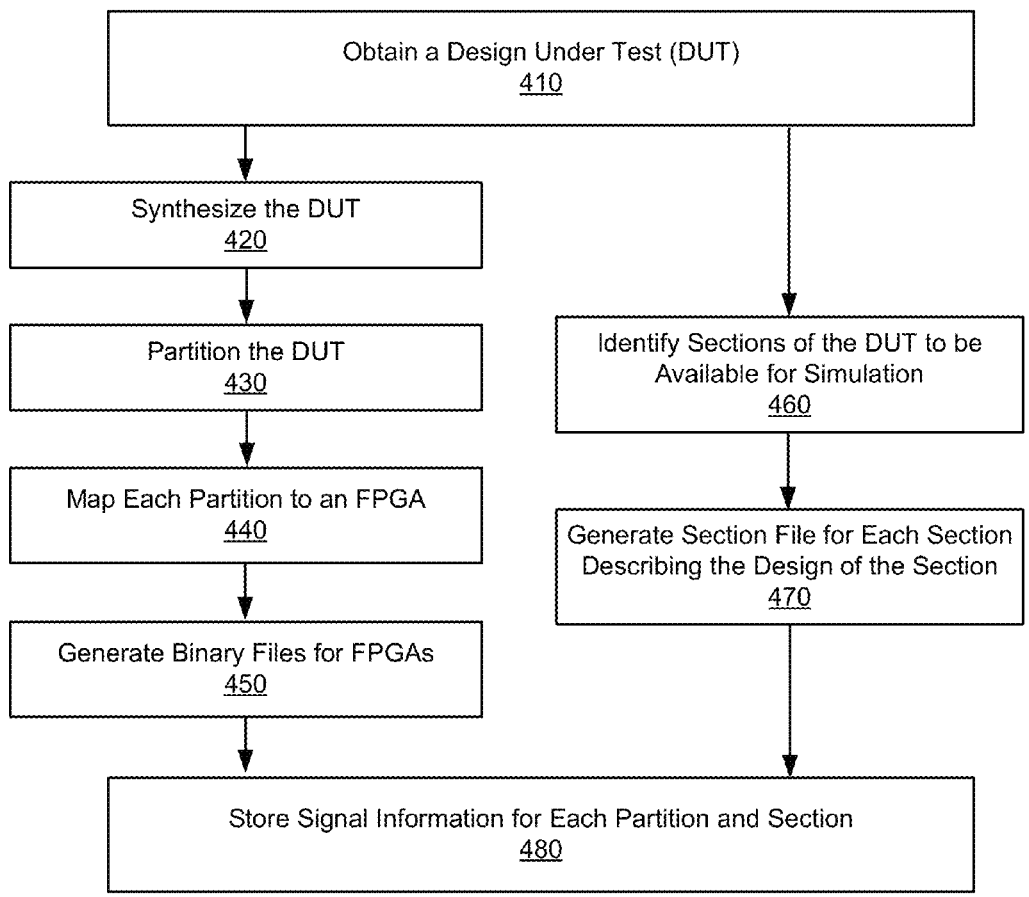
FIG. 4 is a flow chart illustrating the host system preparing for the emulation of the DUT, according to one embodiment.

FIG. 4 is a flow chart illustrating the host system 120 preparing for the emulation of a DUT, according to one embodiment. Other embodiments can perform the steps of FIG. 4 in different orders. Moreover, other embodiments can include different and/or additional steps than the ones described here.

The host system 120 obtains 410 from a user a description of a DUT in HDL. Based on the description of the DUT, the host system 120 generates configuration files for emulating the DUT in the emulator 110 and for simulating sections in the host system 120. Preferably, the host system 120 generates binary files to be loaded in the FPGAs 220 of the emulator 110 and section files to be used by the host system 120 when needed to simulate one or more section. In one embodiment, the host system 120 generates the binary files and section files in parallel.

For generating binary files, the host system 120 synthesizes 420 the HDL description of the DUT to create a gate level netlist. In one embodiment, the host system 120 also obtains a predetermined list of signals of the DUT that should be traceable during the emulation. To be able to trace each signal, the host system 120 incorporates signal tracing logic into the DUT. In one embodiment, the host system 120 incorporates the signal tracing logic by editing the HDL description of the DUT prior to synthesizing the HDL description. In another embodiment, the signal tracing logic is incorporated after synthesizing the HDL description by editing the netlist. In another embodiment, the description of the DUT obtained by the host system 120 includes the signal tracing logic.

The host system 120 partitions 430 the DUT at the gate level into a number of partitions using the gate level netlist. In one embodiment, the host system 120 partitions the DUT by identifying one or more partitions of the DUT to be emulated based on available sections and/or signals needed to perform analysis of the DUT. The host system 120 may identify the one or more partitions in a manner that only a minimum number of signals may be traced. Alternatively, the host system 120 may identify the one or more partitions in a manner that only a minimum number of sections will need to be simulated by the host system 120. The host system 120 maps 440 each partition to a FPGA 220 of the emulator 110. The host system 120 generates 450 binary files that include information to configure the FPGAs 220 to emulate their respective mapped partition of the DUT.

For generating section files, the host system 120 identifies 460 sections of the DUT that are to be available for simulation (e.g., partitions the DUT into a number of sections). After identifying sections of the DUT, the host system 120 generates 470 a section file for each section describing the design of the section. The host system 120 stores the section files. Identifying sections of the DUT may be based on at least any one of synthesizing, partition, and mapping of the DUT for steps 420, 430, and 440 respectively. A list of signals in the identified sections of the DUT may be used for at least any one of synthesizing, partitioning, mapping, and generating binary files of the DUT for steps 420, 430, 440, and 450 respectively.

After generating both the binary files for the FPGAs 220 and section files for the simulation module 340, the host system 120 stores 480 signal information for each partition indicating which signals are traced when the partition is emulated. The host system 120 also stores signal information for each section indicating which signals are traced when the section is simulated and information indicating which input signals are needed to simulate the section. The storing 480 can be done in one or many data-bases, files, hard disks, memories, or external storing devices.

Figure 5:
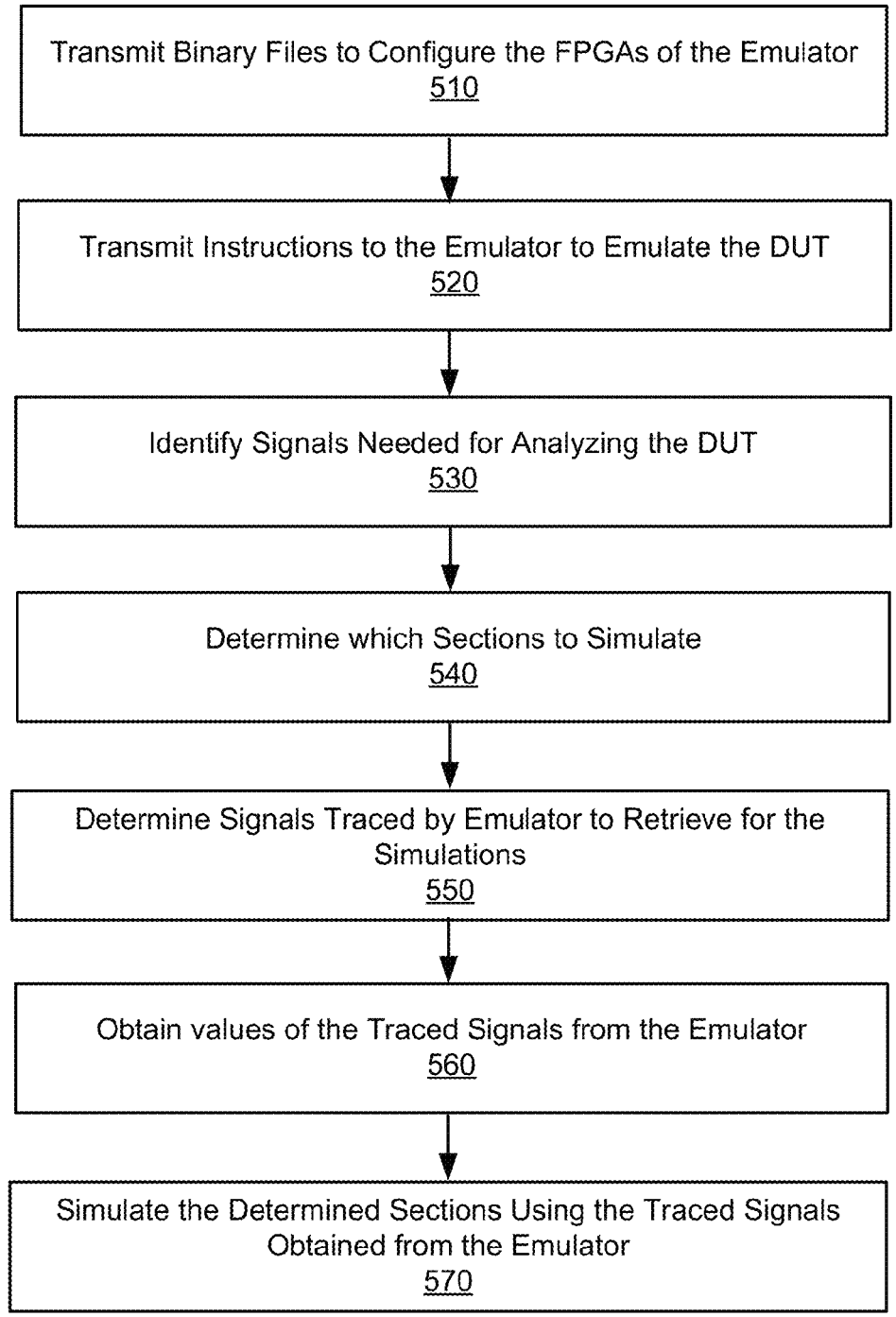
FIG. 5 is a flow chart of configuring the host system and the emulator for tracing signals of a DUT, according to one embodiment.

FIG. 5 is a flow chart of configuring the host system 120 and the emulator 110 for tracing certain signals of the DUT, according to one embodiment. Other embodiments can perform the steps of FIG. 5 in different orders. Moreover, other embodiments can include different and/or additional steps than the ones described here.

The host system 120 transmits 510 to the emulator binary files to configure the FPGAs 220 of the emulator 110 to emulate the DUT. The host system transmits 520 instructions to the emulator 110 to emulate the DUT.

The host system 120 identifies 530 signals of the DUT needed (e.g., by a user or by a system) for analyzing the DUT. The host system 120 determines 540 based on the identified signals which of the sections to simulate from the pool of sections to be able to obtain the identified signals. The host system 120 determines sections to be simulated in a manner that a minimum number of sections or a minimum number of input signals (or traced signals) are needed to produce a desired signal. The host system 120 determines, to simulate, sections that generate one or more of the identified signals when simulated. The host system 120 may determine to simulate a sub-section of a section instead of the entire section. The host system 120 also determines 550 signals traced by the emulator 110 to retrieve for simulating the determined sections.

The host system 120 obtains 560 the determined traced signals from the emulator 110. If a signal needed for analyzing the DUT has already been traced by the emulator 110, the host system 120 also obtains that signal from the emulator 110. The host system 120 simulates 570 the determined sections of the DUT using the traced signals obtained from the emulator 110 and section files describing the design of the sections. Based on the simulation of the sections the signals of the DUT needed are obtained/traced.

Computing Machine Architecture

Figure 6:
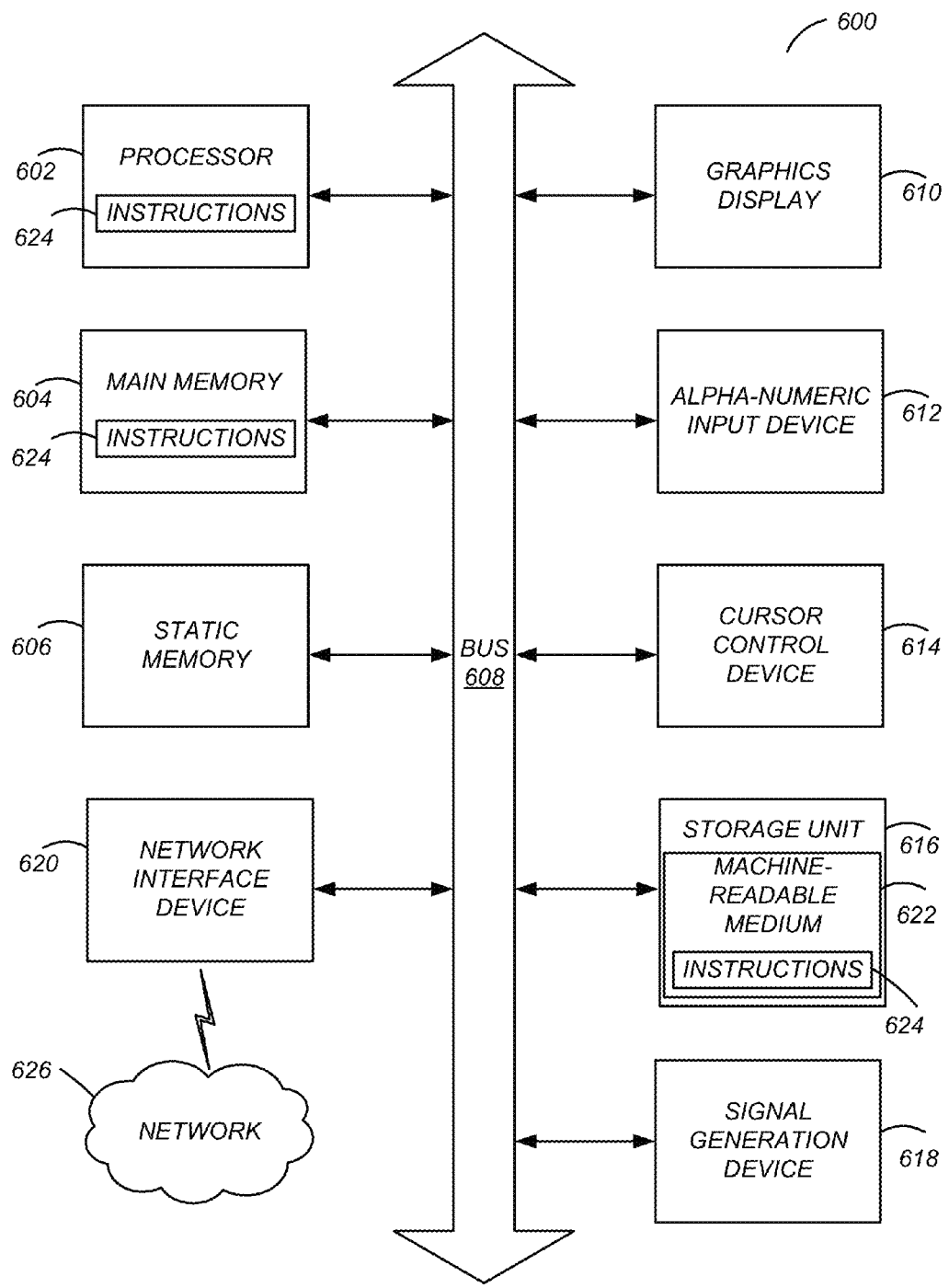
FIG. 6 illustrates one embodiment of components of an example machine able to read instructions from a machine-readable medium and execute them in a processor (or controller).

Turning now to FIG. 6, it is a block diagram illustrating components of an example machine able to read instructions from a machine-readable medium and execute them in one or more processors (or controller). Specifically, FIG. 6 shows a diagrammatic representation of a machine in the example form of a computer system 600 within which instructions 624 (e.g., software or program code) for causing the machine to perform (execute) any one or more of the methodologies described with FIGS. 1-5. In addition, the computer system 600 may be used for one or more of the entities (e.g., host system 120, emulator 110) illustrated in the emulation environment 100 of FIG. 1.

The example computer system 600 includes a processor 602 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 604, and a static memory 606, which are configured to communicate with each other via a bus 608. The computer system 600 may further include graphics display unit 610 (e.g., a plasma display panel (PDP), a liquid crystal display (LCD), a projector, or a cathode ray tube (CRT)). The computer system 600 may also include alphanumeric input device 612 (e.g., a keyboard), a cursor control device 614 (e.g., a mouse, a trackball, a joystick, a motion sensor, or other pointing instrument), a storage unit 616, a signal generation device 618 (e.g., a speaker), and a network interface device 620, which also are configured to communicate via the bus 608. In addition, the computer system 600 may have a touch sensitive display.

The storage unit 616 includes a machine-readable medium 622 on which is stored instructions 624 (e.g., software) embodying any one or more of the methodologies or functions described herein. The instructions 624 (e.g., software) may also reside, completely or at least partially, within the main memory 604 or within the processor 602 (e.g., within a processor's cache memory) during execution thereof by the computer system 600, the main memory 604 and the processor 602 also constituting machine-readable media. The instructions 624 (e.g., software) may be transmitted or received over a network 626 via the network interface device 620.

While machine-readable medium 622 is shown in an example embodiment to be a single medium, the term "machine-readable medium" should be taken to include a single medium or multiple media (e.g., a centralized or distributed database, or associated caches and servers) able to store instructions (e.g., instructions 624). The term "machine-readable medium" shall also be taken to include any medium that is capable of storing instructions (e.g., instructions 624) for execution by the machine and that cause the machine to perform any one or more of the methodologies disclosed herein. The term "machine-readable medium" includes, but not be limited to, data repositories in the form of solid-state memories, optical media, and magnetic media.

As is known in the art, a computer system 600 can have different and/or other components than those shown in FIG. 6. In addition, the computer system 600 can lack certain illustrated components. For example, a computer system 600 acting as the emulator 110 may include one or more hardware processors 602, multiple storage units 616, a network interface device 620, and multiple configurable logic circuits (as described above with reference to FIG. 1), among other components, but may lack an alphanumeric input device 612 and a cursor control device 614. For another example, a computer system 600 acting as a host system 120 may include one or more hardware processors 602. The host system 120 with multiple processors 602 may perform multiple simulations in parallel on multiple threads, processes and/or machines. Subset of sections may be distributed either by a user or automatically by a software program to produce a set of signals based on an input set of signals through simulations performed in parallel.

Additional Configuration Considerations

Beneficially, the disclosed system and method can achieve savings in emulation and simulation resources. By tracing only a few signals (e.g., boundaries of sections) from the emulator, the emulator does not have to trace all signals. Thus values of fewer signals are exchanged between the emulator and the host system, therefore communication bandwidth or throughput can be conserved. Using a few traced signals, the size of the DUT being emulated and verified becomes scalable. In addition, by selecting sections having a minimum number of sections or a minimum number of input signals to produce desired signals for performing an analysis, the emulation and simulation resources can be saved and speed of obtaining values of the desired signals can be improved.

It is noted that although the subject matter is described in the context of emulation environment for emulation of digital circuits and systems, the principles described may be applied to analysis of any digital electronic devices. Moreover, while the examples herein are in the context of an emulation environment including FPGAs, the principles described herein can apply to other analysis of hardware implementations of any digital logic circuitries or software simulation such as EDAs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules (herein may be also referred to as "tools"), or mechanisms, for example, as illustrated in FIGS. 1-5. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. Hardware module implemented herein may be implemented in dedicated and permanently configured circuitry, or in temporarily configured circuitry (e.g., configured by software).

The various operations of example methods described herein may be performed, at least partially, by one or more processors, e.g., processor 602, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for performing the principles described herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-transitory computer readable medium storing instructions, the instructions when executed by one or more processors cause the one or more processors to:
   receive a request for a design signal of a design under test (DUT);
   identify one or more partitions of the DUT to be emulated based on the request for the design signal, the one or more partitions selected to minimize a number of emulation signals traced during emulation;
   store information indicating signals obtainable from the one or more partitions of the DUT, describing designs of a plurality of sections of the DUT, indicating signals obtainable from the plurality of sections, and indicating signals used in simulating each of the plurality of sections;
   receive, from an emulator, an emulation signal of the DUT traced by the emulator based on emulation of the one or more partitions of the DUT;
   determine, from the plurality of sections of the DUT, a subset of sections to simulate to produce the design signal, based on the stored information;
   simulate the subset of sections based on the emulation signal; and
   produce the design signal based on the simulation of the subset of sections.

2. The non-transitory computer readable medium of claim 1, wherein the instructions further configure the one or more processors to produce based on the simulation an additional signal that is not requested.

3. The non-transitory computer readable medium of claim 1, wherein the design signal is not traced by the emulator.

4. The non-transitory computer readable medium of claim 1, wherein the emulation signal is an input of a section included in the subset of sections.

5. The non-transitory computer readable medium of claim 1, wherein the emulation signal is received together with additional emulation signals from the emulator, after completion of the emulation of the DUT.

6. The non-transitory computer readable medium of claim 1, wherein the subset of sections are a portion of another section.

7. The non-transitory computer readable medium of claim 1, wherein the subset of sections includes a first section and a second section, wherein the first section produces an additional design signal based on the emulation signal, and wherein the second section produces the design signal based on the additional design signal.

8. The non-transitory computer readable medium of claim 1, wherein a plurality of emulation signals are received from the emulator, the plurality of emulation signals including the emulation signal, the non-transitory computer readable medium further comprising instructions when executed by the one or more processors further cause the one or more processors to:

select the emulation signal from the plurality of emulation signals for the simulation based on the determined subset of sections.

9. The non-transitory computer readable medium of claim 1, wherein the subset of sections includes a section selected from the plurality of sections based on the stored information indicating that the design signal is obtainable from the section.

10. The non-transitory computer readable medium of claim 1, wherein the subset of sections are simulated on multiple threads running on one or more processors.

11. The non-transitory computer readable medium of claim 1, further comprising instructions that when executed by the one or more processors cause the one or more processors to:

generate the plurality of sections based on a number of signals, or a number of processes executed by the one or more processors to simulate each section.

12. A computer-implemented method comprising:

receiving a request for a design signal of a design under test (DUT);

identifying one or more partitions of the DUT to be emulated based on the request for the design signal, the one or more partitions selected to minimize a number of emulation signals traced during emulation;

storing information indicating signals obtainable from the one or more partitions of the DUT, describing designs of a plurality of sections of the DUT, indicating signals obtainable from the plurality of sections, and indicating signals used in simulating each of the plurality of sections;

receiving, from an emulator, an emulation signal of the DUT traced by the emulator based on emulation of the one or more partitions of the DUT;

determining, from the plurality of sections of the DUT, a subset of sections to simulate to produce the design signal, based on the stored information;

simulating the subset of sections based on the emulation signal; and producing the design signal based on the simulation of the subset of sections.

13. The method of claim 12, wherein the emulation signal is an input of a section included in the subset of sections and the design signal is not traced by the emulator.

14. The method of claim 12, wherein the subset of sections includes a first section and a second section, wherein the first section produces an additional design signal based on the emulation signal, and wherein the second section produces the design signal based on the additional design signal.

15. The method of claim 12, wherein the subset of sections includes a section selected from the plurality of sections based on the stored information indicating that the design signal is obtainable from the section.

16. The method of claim 12, further comprising:

producing based on the simulation an additional signal that is not requested.

17. The method of claim 12, wherein a plurality of emulation signals are received from the emulator, the plurality of emulation signals including the emulation signal, the method further comprising:

selecting the emulation signal from the plurality of emulation signals for the simulation based on the determined subset of sections.

18. The method of claim 12, wherein the subset of sections are simulated on multiple threads running on one or more processors.

19. The method of claim 12, further comprising:

generating the plurality of sections based on a number of signals, or a number of processes executed by one or more processors to simulate each section.

\* \* \* \* \*